United States Patent
Kaneko

(10) Patent No.: US 7,859,248 B2
(45) Date of Patent: Dec. 28, 2010

(54) ELECTRONIC DEVICE TEST APPARATUS AND METHOD OF SETTING AN OPTIMUM PUSHING CONDITION FOR CONTACT ARM OF ELECTRONIC DEVICE TEST APPARATUS

(75) Inventor: Shigeki Kaneko, Tokyo (JP)

(73) Assignee: Advantest Corporation, Tokyo (JP)

( * ) Notice: Subject to any disclaimer, the term of this patent is extended or adjusted under 35 U.S.C. 154(b) by 133 days.

(21) Appl. No.: 12/092,496

(22) PCT Filed: Nov. 9, 2005

(86) PCT No.: PCT/JP2005/020544

§ 371 (c)(1), (2), (4) Date: May 2, 2008

(87) PCT Pub. No.: WO2007/055004

PCT Pub. Date: May 18, 2007

(65) Prior Publication Data

US 2009/0153175 A1    Jun. 18, 2009

(51) Int. Cl.
G01R 31/28    (2006.01)

(52) U.S. Cl. .................................. 324/158.1

(58) Field of Classification Search ......... 324/754–765, 324/158.1
See application file for complete search history.

(56) References Cited

U.S. PATENT DOCUMENTS

| | | | | |
|---|---|---|---|---|
| 6,057,700 A | * | 5/2000 | Crispell | 324/765 |
| 6,069,483 A | * | 5/2000 | Maxwell et al. | 324/760 |
| 6,369,595 B1 | * | 4/2002 | Farnworth et al. | 324/755 |
| 6,456,062 B2 | * | 9/2002 | Yamashita et al. | 324/158.1 |
| 7,309,981 B2 | * | 12/2007 | Yamashita | 324/158.1 |
| 7,554,349 B2 | * | 6/2009 | Kang et al. | 324/760 |
| 2005/0030007 A1 | * | 2/2005 | Sakata | 324/158.1 |
| 2007/0200555 A1 | | 8/2007 | Mizushima et al. | |
| 2007/0296432 A1 | | 12/2007 | Mineo et al. | |
| 2008/0038098 A1 | | 2/2008 | Ito et al. | |
| 2008/0042667 A1 | | 2/2008 | Yamashita et al. | |

FOREIGN PATENT DOCUMENTS

| | | | |
|---|---|---|---|
| JP | 5-259242 | * | 10/1993 |
| JP | 2003-258045 | | 9/2003 |

OTHER PUBLICATIONS

English language Abstract of JP 2003-258045, Sep. 12, 2003.
English language Abstract of JP 5-259242, Oct. 8, 1993.

* cited by examiner

*Primary Examiner*—Ha Tran T Nguyen
*Assistant Examiner*—Richard Isla Rodas
(74) *Attorney, Agent, or Firm*—Greenblum & Bernstein, P.L.C.

(57) ABSTRACT

An electronic device test apparatus comprises: a contact arm making an IC device move and pushing it against a socket 301; a control device controlling the contact arm; an instructing unit instructing the control device on a pushing torque of the contact arm; an acquiring unit acquiring from the tester the result whose a test of an IC device is executed when the contact arm pushes the IC device against the socket according to the torque instructed by the instructing unit; a correction unit correcting the torque on which the control device is instructed on the basis of the test result acquired by the acquiring unit; and a setting unit setting the stroke at the time when the test result is normal as an optimum stroke if the torque was not corrected by the correction unit.

9 Claims, 6 Drawing Sheets

ELECTRONIC DEVICE TEST APPARATUS AND METHOD OF SETTING AN OPTIMUM PUSHING CONDITION FOR CONTACT ARM OF ELECTRONIC DEVICE TEST APPARATUS

TECHNICAL FIELD

The present invention relates to an electronic device test apparatus for testing the electrical characteristics of semiconductor integrated circuit devices or various other electronic devices (hereinafter also referred to representatively as "IC devices"), more particularly relates to an electronic device test apparatus able to automatically set the optimum stroke, the pushing torque or other pushing condition of the contact arm when changing the type of IC devices etc.

BACKGROUND ART

In the process of production of IC devices and other electronic devices, an electronic device test apparatus is used for testing the performance and functions of the electronic devices produced.

One conventional example of an electronic device test apparatus comprises a test unit testing IC devices, a loader unit sending pre-test IC devices to the test unit, and an unloader unit taking out and classifying the tested IC devices from the test unit. Further, the loader unit is provided with a buffer stage able to move back and forth between the loader unit and the test unit, and a loader unit conveyor system having a suction unit able to pick up and hold an IC device and being able to move from a customer tray to a heat plate and from the heat plate to the buffer stage. Further, the test unit is provided with a test unit conveyor system having a contact arm able to pick up and hold an IC device and push it against a test head and being able to move in a region of the test unit.

The loader unit conveyor system picks up and holds an IC device carried on a customer tray by the suction unit and places it on the heat plate, then picks up and holds an IC device on the heat plate heated to a predetermined temperature again by the suction unit and places it on the buffer stage. Further, the buffer stage carrying the IC device moves from the loader unit to the test unit side. Next, the test unit conveyor system uses the contact arm to pick up and hold the IC device on the buffer stage and push it against a socket of the test head to bring the external terminals of the IC device (device terminals) and the connection terminals of the socket (socket terminals) into contact.

In this state, a test signal supplied from the tester body through a cable to the test head is applied to the IC device and a response signal read out from the IC device is sent through the test head and the cable to the tester body to measure the electrical characteristics of the IC device.

However, the stroke of the contact arm along the Z-axial direction when pushing a picked up and held IC device against the socket differs depending on the type of the IC device, so has to be reset each time when changing the type of the IC device under test.

This stroke of the contact arm is generally set by the following teaching operation. First, the theoretical torque is found from the number of contact pins on the socket, the necessary load per pin of the contact pins, the number of sockets on the test head, etc. Next, the contact arm picking up and holding the IC device is moved downward to make the IC device contact the socket. Next, when the actual torque reaches the theoretical torque, the downward movement of the contact arm is stopped. The stroke of the contact arm in this state is taught as the final stroke executed in an actual test.

However, when using this method to teach the stroke, the stroke is not necessarily optimum because it is not possible to judge whether the IC device is reliably in electrical contact with the socket at the time of testing or not unless an actual test is executed.

Further, even if the test is executed normally by the stroke taught by the above method, the lifetime of the socket may be shortened by the IC device being strongly pushed against it when the theoretical torque is unnecessarily strong

DISCLOSURE OF THE INVENTION

The present invention has as its object the provision of an electronic device test apparatus able to automatically set the optimum pushing condition of a contact arm at the time of changing the type of an IC device etc.

(1) To achieve the above object, according to the present invention, there is provided an electronic device test apparatus for bringing a device under test into electrical contact with a socket in order to test the electrical characteristics of the device under test, comprising: a contact arm moving the device under test in a vertical direction relative to the socket and pushing the device under test against the socket; a control means for controlling the movement operation of the contact arm; an instructing means for instructing the control means on the torque of the contact arm when pushing the device under test against the socket; an acquiring means for acquiring from a tester the result whose the test of the device under test is executed when the contact arm pushes the device under test against the socket according to the torque instructed by the instructing means; a correcting means for correcting the torque on which the instructing means instructs the control means on the basis of the test result acquired by the acquiring means; and a setting means for setting the pushing condition of the contact arm at the time of a test where the test result is normal as an optimum pushing condition used at an actual test, if the torque was not corrected by the correcting means.

In the present invention, an instructing means for instructing a control means on a pushing torque, an acquiring means for acquiring a test result, a correcting means for correcting a pushing torque, and a setting means for setting the optimum pushing condition are provided at the electronic device test apparatus.

Further, the contact arm pushes the device under test against a socket by the torque instructed by the instructing means, the tester executes a test in this state, the acquiring means acquires the test result from the tester, the correcting means corrects the torque on the basis of this test result, and the setting means sets the pushing condition of the contact arm when the test is normal as the optimum pushing condition if the torque was not corrected by the correcting means.

Due to this, it becomes possible to automatically set the optimum pushing condition of the contact arm when changing the type of the IC device, changing the socket, etc.

In the electronic device test apparatus according to the present invention, preferably the pushing condition of the contact arm includes a stroke of the contact arm along the vertical direction, and when the torque was not corrected by the correcting means, the setting means sets the stroke of the contact arm along the vertical direction at the time of a test where the test result was normal as an optimum stroke used at the time of an actual test.

Note that the stroke of the contact arm may be measured by again executing a usual test when the torque has not been corrected by the correcting means or may be measured by the setting means each time a test is executed by the tester.

In the electronic device test apparatus according to the present invention, preferably, when the test result acquired from the tester by the acquiring means indicates abnormal, the correcting means executes a correction increase the torque on which the instructing means instructs the control means.

By increasing the torque when the test result indicates abnormal, it is possible to eliminate contact failure between the device under test and the socket due to insufficient stroke.

In the electronic device test apparatus according to the present invention, preferably the apparatus repeats the cycle of the correcting means increasing the torque, the instructing means instructing the control means on the increased torque, and the acquiring means acquiring the result whose the test of the device under test is executed when the contact arm pushes the device under test by the increased torque, until the test result acquired by the acquiring means indicates normal.

In the electronic device test apparatus according to the present invention, preferably the setting of the stroke is stopped when the correcting means executes corrections increasing the torque a predetermined number of times or more.

Due to this, when contact failure between the device under test and the socket is due to a reason other than insufficient stroke and electrical contact between the device under test and the socket finally cannot be secured, the optimum stroke setting work can be stopped.

In the electronic device test apparatus according to the present invention, preferably, when the test result acquired by the acquiring means indicates normal, the correcting means does not correct the torque and the setting means sets the stroke at said time of the test as the optimum stroke.

In the electronic device test apparatus according to the present invention, preferably, when the test result acquired by the acquiring means is normal, the correcting means executes a correction so as to reduce the torque on which the instruction means instructs the control means.

By reducing the torque when electrical contact between the device under test and the socket is secured, it is possible to prevent shortening of the life of the socket due to excessive torque.

In the electronic device test apparatus according to the present invention, preferably the apparatus repeats the cycle of the correcting means reducing the torque, the instructing means instructing the control means on the reduced torque, and the acquiring means acquiring the result whose the test of the device under test is executed when the contact arm pushes the device under test by the reduced torque, until the test result acquired by the acquiring means indicates abnormal.

In the electronic device test apparatus according to the present invention, preferably, when the N+1st (where, N is a natural number) test result acquired by the acquiring means indicates abnormal, the correcting means does not correct the torque and the setting means sets the stroke at the N-th test as the optimum stroke.

In the electronic device test apparatus according to the present invention, preferably the torque decrease rate per time reduced by the correcting means is smaller relative to the torque increase rate per time increased by the correcting means.

In the electronic device test apparatus according to the present invention, preferably the pushing condition of the contact arm includes a pushing torque of the contact arm, and when the torque was not corrected by the correcting means, the setting means sets, instead of the optimum stroke or in addition to the optimum stroke, the torque at the time of a test where the test result is normal as an optimum torque used at the time of an actual test.

(2) To achieve the above object, according to the present invention, there is provided a method of setting an optimum pushing condition for a contact arm pushing a device under test against a socket to bring the device under test into electrical contact with the socket and test electrical characteristics of the device under test, comprising: an instruction step of instructing a control means for controlling movement of the contact arm on a torque of the contact arm when pushing the device under test against the socket; a test step of pushing the device under test against the socket by the contact arm according to the torque instructed in the instruction step and testing the device under test by a tester; an acquisition step of acquiring a test result of the device under test from the tester, a correction step of correcting the torque on which the control means is instructed in the instruction step on the basis of the test result acquired in the acquisition step; and a setting step of setting the pushing condition of the contact arm at the time of a test where the test result is normal as the actual pushing condition used at an actual test, if the torque was not corrected at in the correction step.

In the present invention, the control means is instructed on the torque in the instruction step, the contact arm pushes the device under test against the socket by that torque and the tester run the test under that state in the test step, the test result is acquired from the tester in the acquisition step, the torque is corrected on the basis of the test result in the correction step, and the pushing condition of the contact arm at the time of a normal test is set as the optimum pushing condition in the setting step if the torque was not corrected in the correction step.

Due to this, it is possible to automatically set the optimum pushing condition of the contact arm when changing the type of the IC device or changing the socket.

In the method of setting optimum pushing condition for a contact arm according to the present invention, preferably the pushing condition of the contact arm includes a stroke of the contact arm along the vertical direction, and when the torque was not corrected in the correction step, the stroke of the contact arm along the vertical direction at the time of a test where the test result was normal is set as an optimum stroke used at the time of an actual test in the setting step.

Note that the stroke of the contact arm may be measured by again running a usual test in the setting step when the torque has not been corrected in the correction step or may be measured each time a test is executed by the tester at the test step.

In the method of setting the optimum pushing condition according to the present invention, preferably, when the test result acquired in the acquisition step indicates abnormal, a correction to increase the torque on which the control means is instructed is executed in the correction step.

By increasing the torque when the test result indicates abnormal, it is possible to eliminate contact failure between the device under test and socket due to insufficient stroke.

In the method of setting the optimum pushing condition according to the present invention, preferably the correction step, the instruction step, the test step, and the acquisition step are repeated until the test result acquired in the acquisition step indicates normal.

In the method of setting the optimum pushing condition according to the present invention, preferably the setting of the stroke is stopped when the correction step has been executed a predetermined number of times or more.

Due to this, when the contact failure of the device under test and the socket is due to a reason other than insufficient stroke and electrical contact between the device under test and the socket finally cannot be secured, the work for setting the optimum pushing condition can be stopped.

In the method of setting the optimum pushing condition according to the present invention, preferably, when the test result acquired in the acquisition step indicates normal, the torque is not corrected in the correction step and the stroke at the time of the test is set as the optimum stroke in the setting step.

In the method of setting the optimum pushing condition according to the present invention, preferably, when the test result acquired in the acquisition step indicates normal, a correction to reduce the torque on which the control means is instructed is executed in the correction step.

By reducing the torque when electrical contact between the device under test and the socket is secured, it is possible to prevent shortening of the life of the socket due to excessive torque.

In the method of setting the optimum pushing condition according to the present invention, preferably the correction step, the instruction step, the test step, and the acquisition step are repeated until the test result acquired from the tester is abnormal in the acquisition step.

In method of setting the optimum pushing condition according to the present invention, preferably, when the N+1st (where N is a natural number) test result acquired in the acquisition step indicates abnormal, the torque is not corrected in the correction step and the stroke at the time of the N-th test is set as the optimum stroke in the setting step.

In the method of setting the optimum pushing condition according to the present invention, preferably the torque decrease rate per time reduced in the correction step is smaller relative to the torque increase rate per time increased in the correction step.

In the method of setting the optimum pushing condition according to the present invention, preferably the pushing condition of the contact arm includes a pushing torque of the contact arm, and when the torque is not corrected in the correction step, instead of the optimum stroke or in addition to the optimum stroke, the torque at the time of a test where the test result is normal is set as an optimum torque used at an actual test in the setting step.

DESCRIPTION OF NOTATIONS

Figure 1:
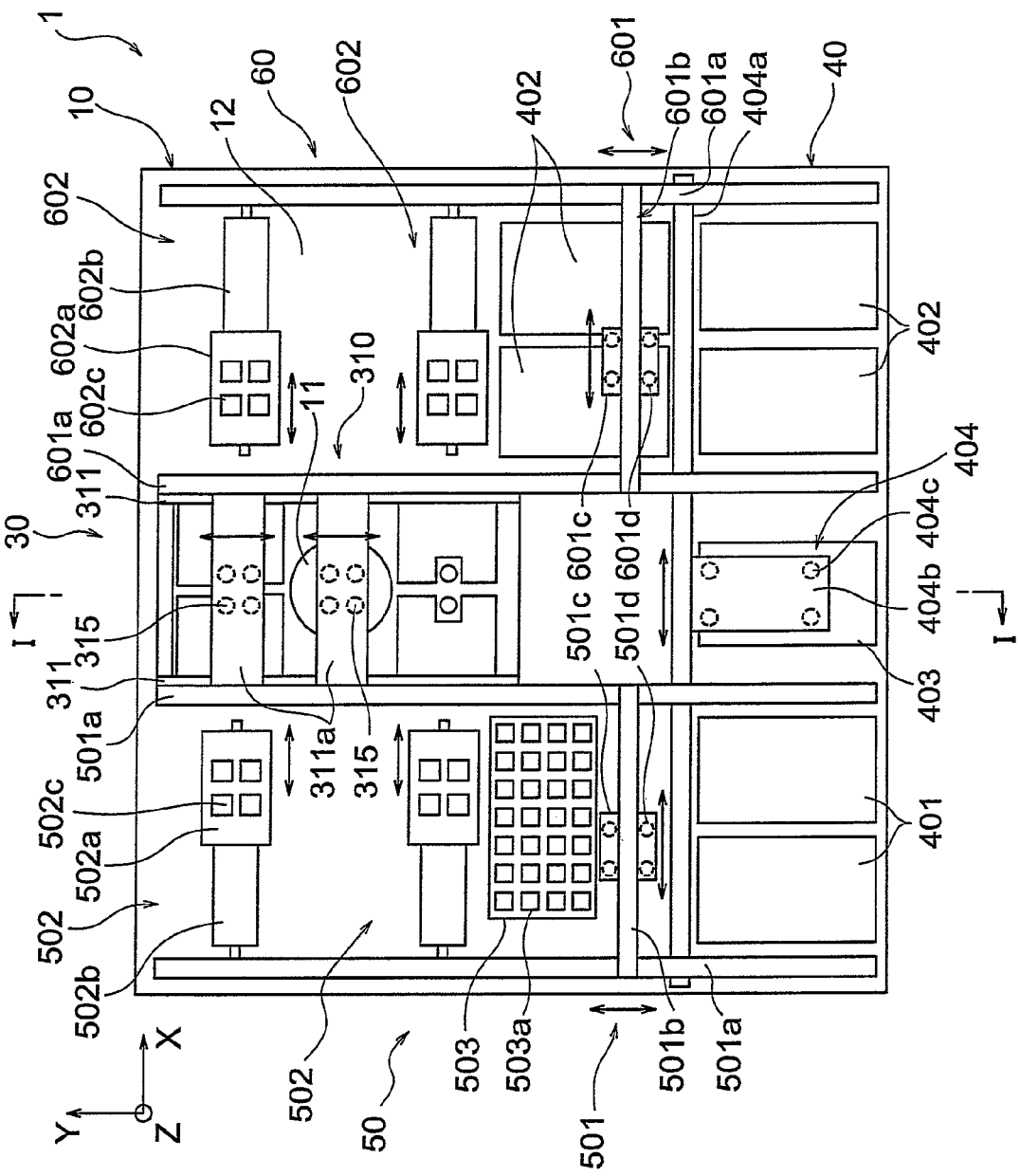
FIG. 1 is a plan view of an electronic device test apparatus according to an embodiment of the present invention.

1 ... electronic device test apparatus
10 ... electronic device test apparatus (handler)
20 ... tester
300 ... test head
301 ... socket
312 ... contact arm
313 ... Z-axial direction actuator
316 ... control device
320 ... stroke setting device
321 ... instructing unit
322 ... acquiring unit
323 ... correction unit
324 ... setting unit
325 ... alarm unit

BEST MODE FOR CARRYING OUT THE INVENTION

Below, an embodiment of the present invention will be explained with reference to the drawings.

As the type of the IC device (device under test) in this embodiment, as one example, there is a BGA package, CSP (chip size package), etc. provided with solder balls as device terminals, but the present invention is not limited to this. For example, there is a QFP (quad flat package), SOP (small outline package), etc. provided with lead pins as device terminals.

Figure 2:
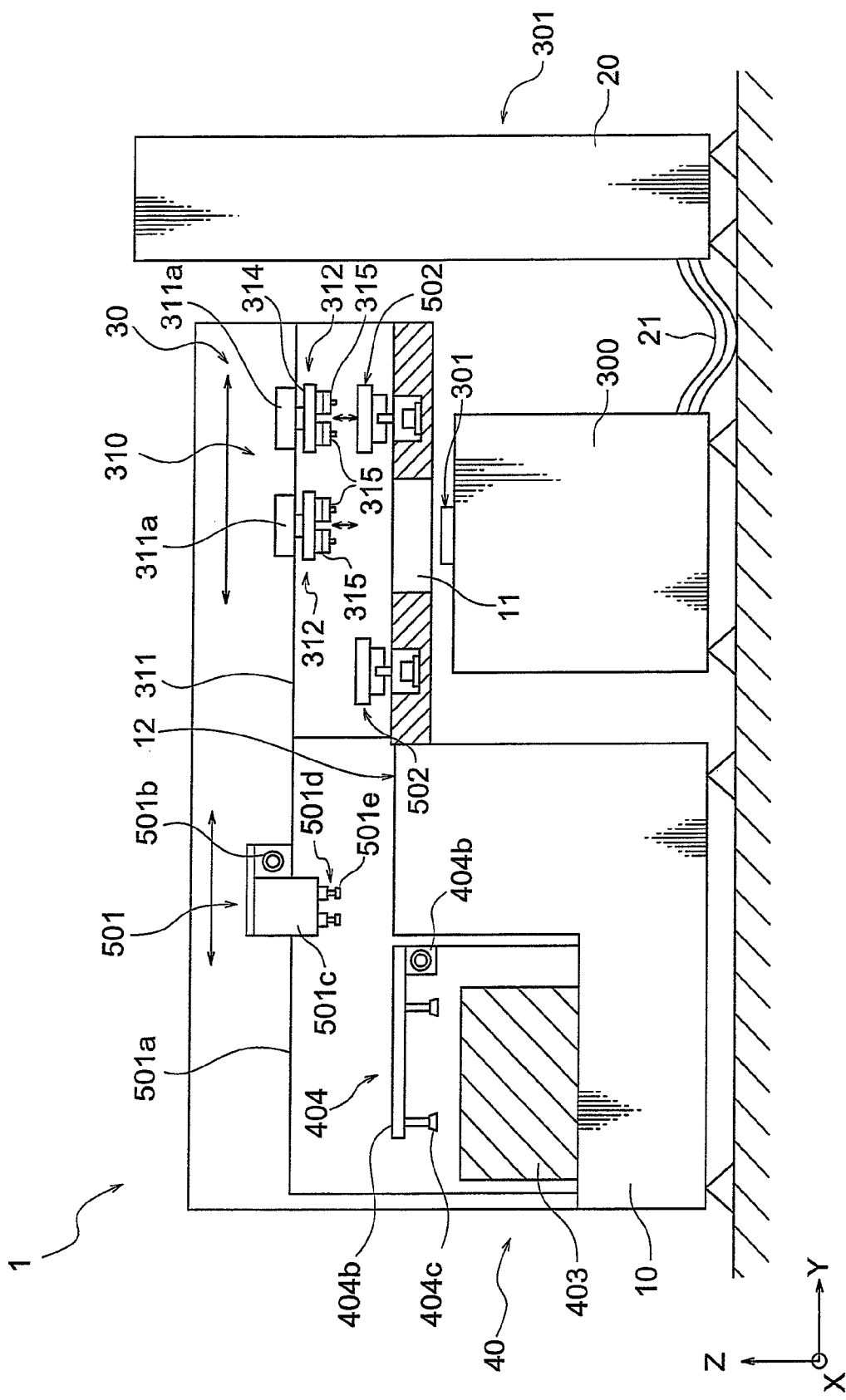
FIG. 2 is a partial cross-sectional side view of an electronic device test apparatus shown in FIG. 1 (cross-sectional view along line I-I in FIG. 1).
Figure 3:
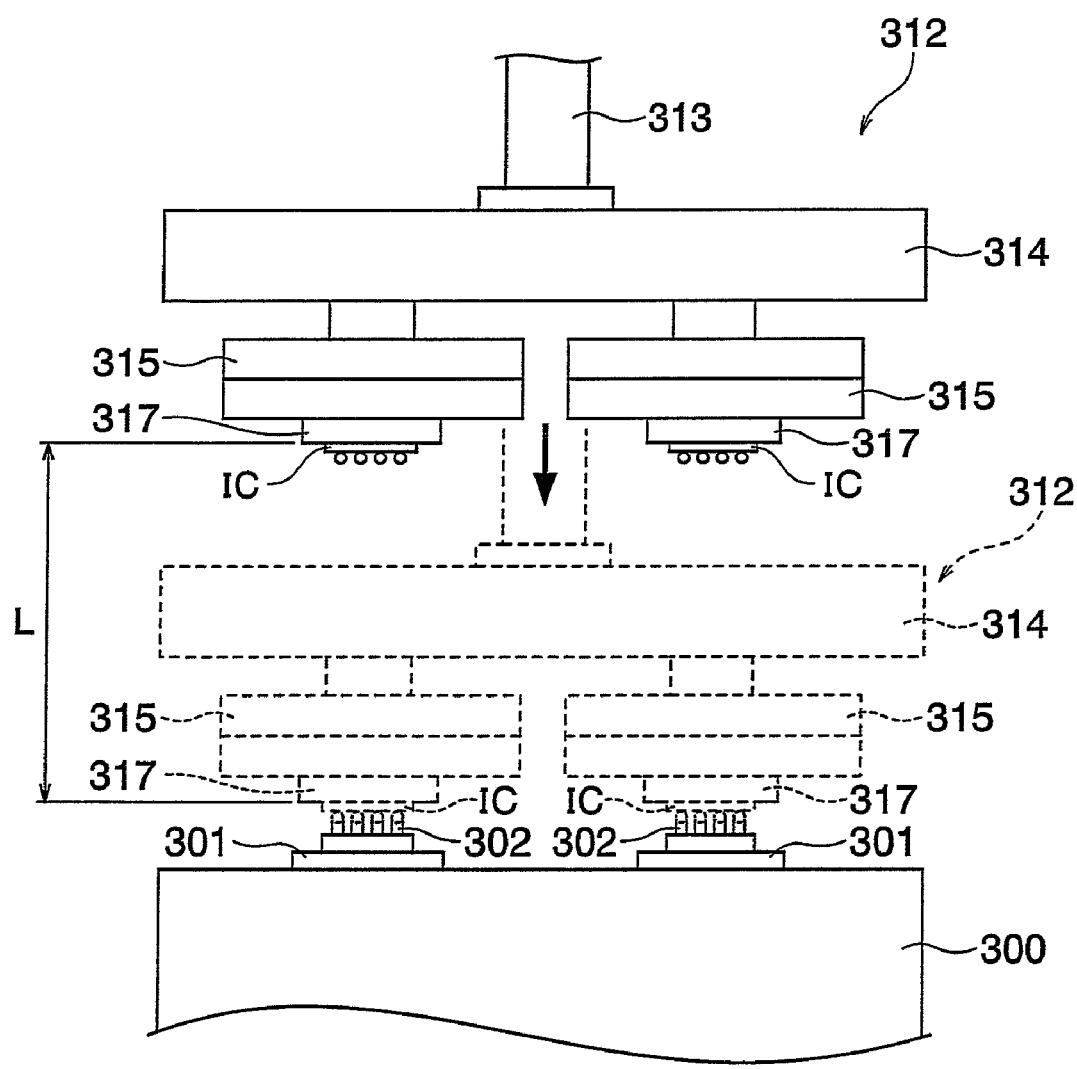
FIG. 3 is a side sectional view of a contact arm used in the electronic device test apparatus shown in FIG. 1 wherein the solid lines show the state before downward movement and the broken lines show the state of pushing IC devices against sockets.

As shown in FIG. 1 to FIG. 3, according to the present embodiment, the electronic device test apparatus 1 comprises a handler 10, a test head 300, and a tester 20. The test head 300 and tester 20 are connected through a cable 21. Further, pre-test IC devices on the feed tray stored in a feed tray stocker 401 of the handler 10 are conveyed and pushed against sockets 301 of the test head 300, the tester 20 tests the IC device through this test head 300 and cable 21, then the IC devices finished being tested are placed in accordance with the test result to a classification tray stored in a classification tray stocker 402.

The handler 10 comprises a test unit 30, an IC device storage unit 40, a loader unit 50, and an unloader unit 60. Below, each unit will be explained.

<IC Device Storage Unit 40>

The IC device storage unit 40 is a part for storing the pre-test and post-test IC devices. This IC device storage unit 40 comprises feed tray stockers 401, classification tray stockers 402, empty tray stockers 403, and a tray conveyor system 404.

The feed tray stockers 401 stock a stack of a plurality of feed trays on which a plurality of pre-test IC devices are carried. In the present embodiment, as shown in FIG. 1, two feed tray stockers 401 are provided in the IC device storage unit 40.

The classification tray stockers 402 stock a stack of a plurality of classification trays on which a plurality of post-test IC devices are carried. In the present embodiment, as illustrated, four classification tray stockers 402 are provided in the IC device storage unit 40. By providing these four classification tray stockers 402, it is possible to sort and store the IC devices into a maximum of four classes in accordance with the test results.

The empty tray stockers 403 store empty trays of feed trays from which all pre-test IC devices which had been carried have been supplied to the test unit 30. Note that the numbers of the stockers 401 to 403 may be suitably set in accordance with need.

The tray conveyor system 404 is a conveyor system able to move trays along the X-Z-axial direction in FIG. 1. This tray conveyor system 404 comprises an X-axial direction rail 404a, a movable head 404b, and four suction pads 404c. This tray conveyor system 404 has a range of operation including the feed tray stockers 401, part of the classification tray stockers 402 (the lower two classification tray stockers in FIG. 1), and the empty tray stockers 403.

The X-axial direction rail 404*a* is fixed to a base plate 12 of the handler 10. This X-axial direction rail 404*a* supports a movable head 404*b* to be able to move in the X-axial direction in a cantilever manner. The movable head 404*b* is provided with four suction pads 404*c* through an Z-axial direction actuator (not shown)

When the pre-test IC devices are emptied from a feed tray at the tray stocker 401, the tray conveyor system 404 picks up and holds an empty tray by the suction pads 404 at the empty tray stocker 403, rises it by a Z-axial direction actuator, and moves the movable head 404*b* on the X-axial direction rail 404*a* so as to transfer the empty tray from the feed tray stocker 401 to the empty tray stocker 403.

Further, this tray convey or system 404 picks up and holds a classification tray filled with post-test IC devices at the classification tray stocker 402 by the empty tray stocker 403, makes it rise by a Z-axial direction actuator, and makes the movable head 404*b* move on the X-axial direction rail 404*a* so as to transfer an empty tray from an empty tray stocker 403 to the classification tray stocker 402.

<Loader Unit 50>

The loader unit 50 is a part feeding a pre-test IC device from the feed tray stocker 401 of the IC device storage unit 40 to the test unit 30. This loader unit 50 comprises a loader unit conveyor system 501, two loader buffer units 502 (two at left side in FIG. 1), and a heat plate 503.

The loader unit conveyor system 501 is a device moving an IC device on a feed tray stacked in the feed tray stocker 401 of the IC device storage unit 40 onto the heat plate 503 and moving an IC device on the heat plate 503 onto a loader buffer unit 502. This loader unit conveyor system 501 comprises Y-axial direction rails 501*a*, an X-axial direction rail 501*b*, a movable head 501*c*, and suction units 501*d*. This loader unit conveyor system 501 has a range of operation including the feed tray stockers 401, heat plate 503, and two loader buffer units 502.

As shown in FIG. 1, two Y-axial direction rails 501*a* are fixed on a base plate 12 of the handler 10. Between them, an X-axial direction rail 502*b* is supported movable in the Y-axial direction. The X-axial direction rail 502*b* is provided with a movable head 501*c* having a Z-axial direction actuator (not shown) so as to be movable in the X-axial direction.

The movable head 501*c* has four suction units 501*d* having suction pads 501*e* at its bottom end. By driving the above Z-axial direction actuator, the four suction units 501*d* can be made to independently ascend and descend in the Z-axial direction.

Each of the suction pads 501*d* is connected to a negative pressure source (not shown). By sucking air from a suction pad 501*e* and generating negative pressure, an IC device can be picked up and held. Further, by stopping the suction of air from a suction pad 501*e*, an IC device can be released.

The heat plate 503 is a heating source for applying a predetermined thermal stress to an IC device to conduct a high temperature test. For example, it is comprised of a metal heat transfer plate having a heat generating source (not shown) at the bottom part. At the top surface side of the heat plate 503, a plurality of recesses 503*a* for dropping in IC devices are formed. Note that when conducting a low temperature test, it is also possible to provide a cooling source instead of a heating source.

Each loader buffer unit 502 is a device for moving an IC device between the range of operation of the loader unit conveyor system 501 and the range of operation of the test unit conveyor system 310. This loader buffer unit 502 comprises a buffer stage 502*a* and an X-axial direction actuator 502*b*.

The X-axial direction actuator 502*b* is fixed on the base plate 12 of the handler 10 and supports a buffer stage 502*a* at one end of this X-axial direction actuator 502*b*. As shown in FIG. 1, the top surface of the buffer stage 502*a* is formed with four planar view rectangular recesses 502*c* for dropping in IC devices.

A pre-test IC device is moved by the loader unit conveyor system 501 from a feed tray stocker 401 to the heat plate 503. It is heated by the heat plate 503 to a predetermined temperature, then again moved to a loader buffer unit 502 by the loader unit conveyor system 501 and, further, is fed into the test unit 30.

<Test Unit 30>

The test unit 30 is a part for bringing external terminals (solder balls) of an IC device under test into electrical contact with the contact pins 302 of a socket 301 for conducting a test. The test unit 30 in the present embodiment comprises a test unit conveyor system 310 and a stroke setting device 320.

The test unit conveyor system 310 is a device pushing a pre-test IC device fed into the test unit 30 by a loader buffer unit 502 against a socket 301 and further discharging a post-test IC device to the unloader buffer unit 602. This test unit conveyor system 310 comprises Y-axial direction rail 311*s*, X-axial direction rails 311*a*, and contact arms 312.

As shown in FIG. 1 and FIG. 2, two Y-axial direction rails 311 are fixed on the base plate 12 of the handler 10. Between these, two X-axial direction rails 311*a* are supported to be movable in the Y-axial direction. At the approximate center of each X-axial direction rail 311*a*, a contact arm 312 is provided.

Each contact arm 312 has a range of operation including the loader buffer unit 502, the unloader buffer unit 602 and the test head 300. Note that the two X-axial direction rails 311*a* operating simultaneously on the pair of Y-axial direction rails 311 are controlled by the control device 316 so that their operations do not interfere with each other.

As shown in FIG. 3, each contact arm 312 comprises a Z-axial direction actuator 313 fixed on an X-axial direction rail 311*a* at its top end, a support base 314 fixed on the bottom end of the Z-axial direction actuator 313, and four holding parts 315 fixed on the support base 314 at the top end.

The four holding parts 315 are provided on the support base 314 so as to correspond to the array of the sockets 301. Further, the front ends of the holding parts 315 are respectively provided with suction units 317. Note that the holding parts 315 used for high temperature tests/low temperature tests are provided with heating means/cooling means (not shown). Each of the suction pads 317*d* is connected to a negative pressure source (not shown). By sucking air from a suction unit 317 and generating negative pressure, an IC device can be picked up and held. Further, by stopping the suction of air from a suction unit 317, an IC device can be released.

As shown in FIG. 3, the test head 300 comprises four sockets 301 in the present embodiment. The four sockets 301 are arranged at the top part of the test head 300 so as to substantially match the array of the four holding parts 315 of the contact arms 312. Each socket 301 has a plurality of contact pins 302 arranged so as to substantially match the array of solder balls of an IC device.

As shown in FIG. 2, in the test unit 30, the base plate 12 of the handler 10 is formed with an opening 11. Further, a test head 300 is provided below the base 12 so that the sockets 301 approach from the opening 11 to enable the IC devices to face the sockets 301 through the opening 11.

The four pre-test IC devices carried on the loader buffer unit 502 are moved to above the sockets 301 of the test head 300 by the test unit conveyor system 310. Further, as shown in FIG. 3, the Z-axial direction actuators 313 of the contact arms 312 descend along the Z-axial direction by the stroke L, whereby the IC devices are pushed against the sockets 301. In the state with the IC devices and sockets 301 in electrical contact, the tester 20 simultaneously tests the four IC devices. After this, they are moved to the unloader buffer unit 602 by the test unit conveyor system 310 and are ejected from the unloader unit 60 by the unloader buffer unit 602.

Further, in the present embodiment, the test unit 30 comprises a stroke setting device 320. This stroke setting device 320 is a device for automatically setting the optimum stroke of the Z-axial direction actuators 313 of the contact arms 312 when changing the type of the IC device, changing the socket 301, etc. This stroke setting device 320 is comprised of a CPU, memory, etc. Functionally, as shown in FIG. 4, it comprises an instructing unit 321, an acquiring unit 322, a correction unit 323, a setting unit 324, and an alarm unit 325.

The instructing unit 321 has the function of instructing the control device 316 on the torque of the Z-axial direction actuators 313 when using the contact arms 312 to push the IC devices against the sockets 301. This instructing unit 321 instructs the control device 316 on the theoretical torque input by the operator through a keyboard (not shown) as the initial torque in the stroke automatic setting work. As opposed to this, after the initial time, it instructs the control device 316 on the torque corrected by the correction unit 323.

Figure 4:
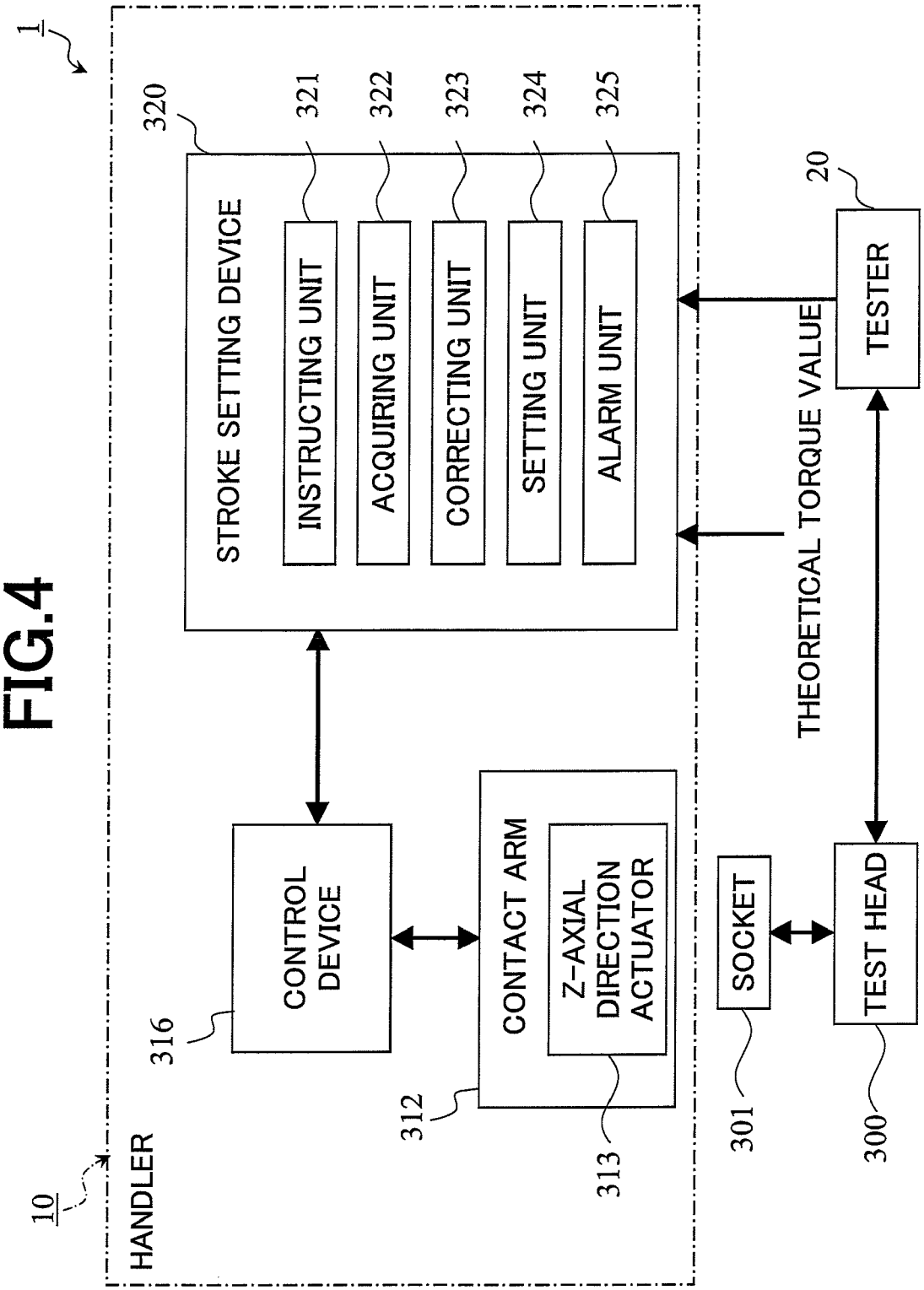
FIG. 4 is a block diagram showing an electronic device test apparatus according to an embodiment of the present invention.

The acquiring unit 322, as shown in FIG. 4, is connected to the tester 20 and has the function of acquiring from the tester 20 the result whose a test of an IC device is executed by the tester 20 when a contact arm 312 actually pushes an IC device against a socket 301 according to the torque instructed by the instructing unit 321.

The correction unit 323 has the function of correcting the torque on which the instructing unit 321 is instructed the control device 316 in accordance with the test result acquired by the acquiring unit 322. This correction unit 323 executes a correction to increase the torque when the test result acquired by the acquiring unit 322 indicate abnormal. As opposed to this, this correction unit 323 executes a correction to decrease the torque when the test result acquired by the acquiring unit 323 indicates normal. Further, this correction unit 323 has a counter for counting the number of times of corrections increasing the torque and has the function of stopping the stroke automatic setting work by the stroke setting device 320 when the number of the counter reaches the predetermined number of times.

The setting unit 324 has the function of making the tester again execute a test by the torque value of a test where the test result was normal, measuring the stroke L at that test, and setting the stroke L in the control device 316 as the optimum stroke used at the time of an actual test, if the correction unit 323 did not correct the torque. The stroke L measured by the setting unit 324, as shown in FIG. 3, is the length of extension of a contact arm 312 along the Z-axial direction from the state positioned above the sockets 301 to when the IC devices contact the sockets 301. For example, when the Z-axial direction actuator 313 comprises an electric motor for driving a ball-screw mechanism etc., this setting unit 324 utilizes the output pulses from an encoder provided at the motor to calculate the stroke L.

The alarm unit 325 has the function of alerting the operator to the fact that the setting work of the stroke by the stroke setting device 320 has been stopped when the downward correction by the correction unit 323 has been executed a predetermined number of times.

<Unloader Unit 60>

The unloader unit 60 is a part for ejecting a post-test IC device from the test unit 30 to the IC device storage unit 40. The unloader unit 60 comprises an unloader unit conveyor system 601 and two unloader buffer units 602 (two at right side in FIG. 1).

Each unloader buffer unit 602 is a device for moving an IC device between the range of operation of the test unit conveyor system 310 and the range of operation of the unloader unit conveyor system 601. This unloader buffer unit 602 comprises a buffer stage 602a and an X-axial direction actuator 602b.

The X-axial direction actuator 602b is fixed on the base plate 12 of the handler 10. A buffer stage 602a is supported at one end of this X-axial direction actuator 602b. At the top surface of this buffer stage 602a, four recesses 602c for dropping in IC devices are formed.

The unloader unit conveyor system 601 is a system for moving and carrying IC devices on an unloader buffer unit 602 to a classification tray on the classification tray stocker 402. This unloader unit conveyor system 601 comprises a Y-axial direction rail 601a, X-axial direction rail 601b, movable head 601c, and suction unit 601d. This unloader unit conveyor system 601 has a range of operation including the two unloader buffer units 602 and the classification tray stocker 402.

As shown in FIG. 1, the two Y-axial direction rails 601a are fixed on the base plate 12 of the handler 10. Between these, X-axial direction rails 602b are supported movable in the Y-axial direction. Each X-axial direction rail 602b is provided with a movable head 601c having an Z-axial direction actuator (not shown) movable in the X-axial direction.

The movable head 601c is provided at its bottom end with four suction units 601d having suction pads. By driving the above Z-axial direction actuators, the four suction units 601d can be made to independently ascend and descend in the Z-axial direction.

A post-test IC device carried on the unloader buffer unit 602 is ejected from the test unit 30 to the unloader unit 60 and placed from the unloader buffer unit 602 to the classification tray stocker 402 by the unloader unit 601.

Next, the method of setting the optimum stroke of a contact arm according to the present embodiment executed after changing the type of the IC device or after changing the socket 301 will be explained with reference to FIG. 5A and FIG. 5B.

Figure 5A:
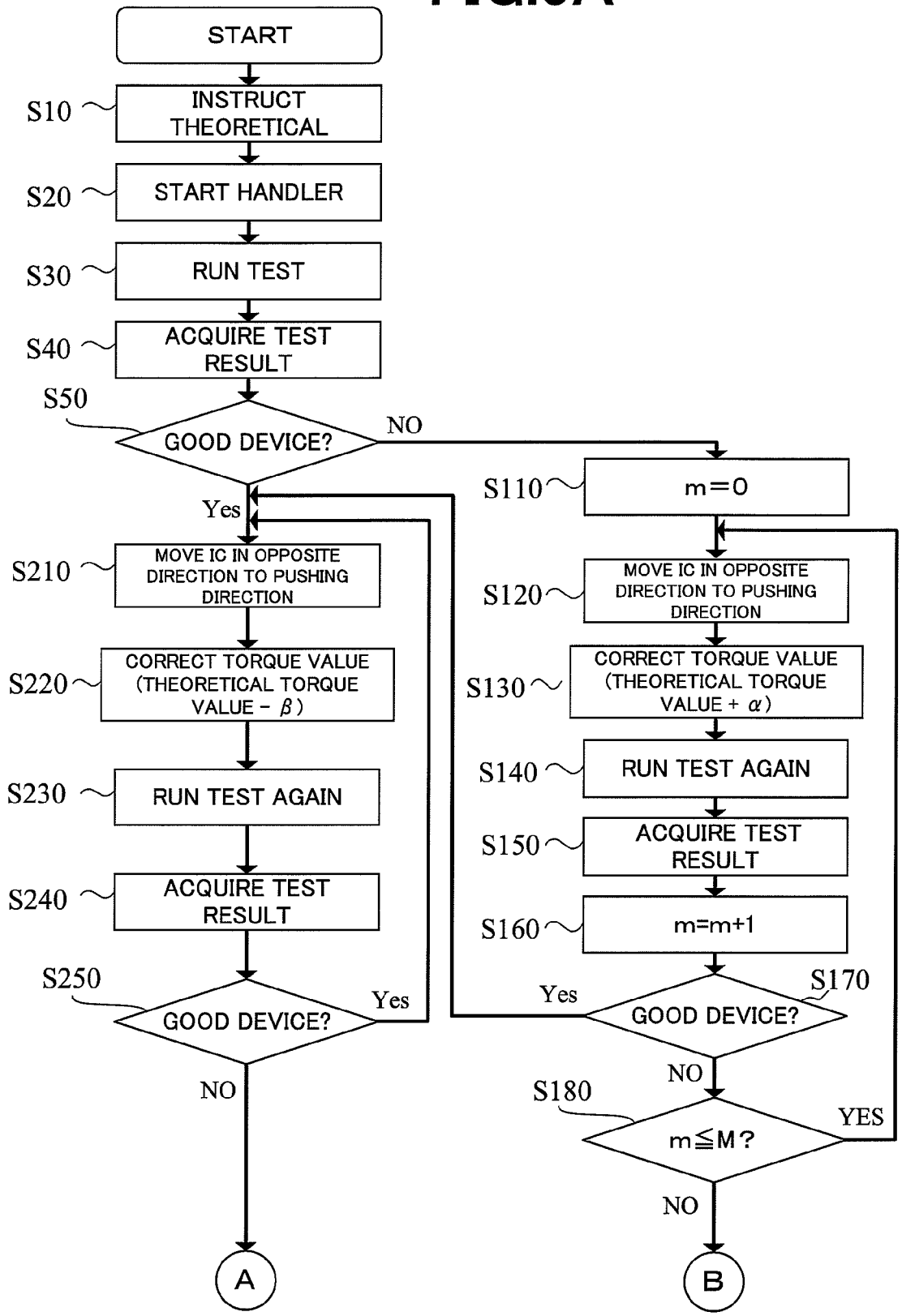
FIG. 5A is a flowchart showing the method of setting an optimum stroke of a contact arm according to an embodiment of the present invention (part 1).

First, as shown at the step S10 of FIG. 5A, the operator uses a keyboard (not shown) to input a theoretical torque in an instructing unit 321 of the stroke setting device 320. This "theoretical torque" is calculated from the load per pin of the contact pins 302, the number of contact pins 302 on the socket 301, the number of sockets 301 on the test head 300, etc. For example, when the load per pin of the contact pins 302 is 10 g, the number of pins of the contact pins 302 on a socket 301 is 1000 pins, and the number of sockets 301 on the test head 300 is four, what is needed is a pushing load of 40 kg (=10 [g]×1000 [pins]×4).

Further, in this step S10, in addition to the input of the theoretical torque, the operator uses the keyboard to input a category number showing a good device in the test result acquired by the tester 20 or inputs a maximum allowable limit stroke for preventing damage of the contact arms 312 and sockets 301.

Next, the operator pushes the test start button (not shown) of the handler 10 to start the IC device test operation for automatically setting the stroke (the step S20). Due to this operator operation, the loader unit conveyor system 501 conveys an IC device from the feed tray stocker 401 of the IC device storage unit 40 to the loader buffer unit 502 and the loader buffer unit 502 supplies the IC device to the test unit conveyor system 310 of the test unit 30. The test unit conveyor system 310 moves the IC device to above a socket 301 of the test head 300, and the contact arm 312 makes the IC device descend toward the socket 301 and push the IC device against the socket 301. Further, if the pushing torque of the contact arm 312 reaches the theoretical torque instructed by the instructing unit 321, the control device 316 stops the descending operation of the contact arm 312. In this state, the tester 200 tests the IC device through test head 300 and socket 301 (the step S30). Note that the IC device used for the test for setting this optimum stroke is one which is confirmed in advance to be a good device.

At the time of this test, the acquiring unit 322 acquires the test result from the tester 20 (the step S40 of FIG. 5). Here, the test result acquired from the tester 20 is expressed by a category number of "1" for a good device and a category number of other than "1" for a defective device (for example, a category number of "2", "3", etc.) Note that at the above step S10, the fact that a good device is expressed by the category number "1" is input by an operator into the instructing unit 321 of the stroke setting device 320.

Next, the correction unit 323 judges whether the test result acquired by the acquiring unit 322 is "1" or not (the step S50).

When it is judged in this step S50 that the test result is other than "1" (NO in the step S50), to eliminate the contact failure between the IC device and the socket 301 due to insufficient stroke, the stroke setting device 320 executes a correction to increase the torque in the steps S110 to S180. Note that the processing when it is judged at step S50 that the test result is "1" (that is, the processing of the step S210 or later) will be explained later.

First, at the step S110, the correction unit 323 resets the counter m (m=0), then the control device 316 executes control to rise the contact arm 321 (the step S120).

Next, the correction unit 323 executes a correction to increase the torque. The instructing unit 321 instructs the control device 316 on this corrected torque (the step S130). The increase rate α of the torque corrected by the correction unit 323 is, for example, about 10% or so of the torque before correction. Note that the torque which the correction unit 323 increases in the step S130 is the theoretical torque inputted by the operator at the step S10 when proceeding directly from the step S50 and is the corrected torque corrected at the step S130 of the immediately nearby cycle when already going through the step S130.

Next, the contact arm 312 again lowers the IC device toward the socket 301 and pushes the IC device against the socket 301. When the pushing torque of the contact arm 312 reaches the correction torque instructed from the instructing unit 321, the control device 316 stops the descending operation of the contact arm 312. In this state, the tester 20 tests the IC device (the step S140).

Next, in the step S150, the acquiring unit 322 acquires the test result from the tester 20, and, in the step S160, the correcting means 323 counts the number of corrections of the counter (m=m+1).

Next, the correction unit 323 judges whether the test result acquired by the acquiring unit 322 is "1" or not (the step S170).

When it is judged in this step S170 that the test result is "1" (YES in the step S170), the electrical contact between the IC device and the socket 301 has been secured, so a correction to reduce the torque in the steps S210 to S250 of FIG. 5A is executed. The processing of this step S210 or later will be explained later.

When it is judged in this step S170 that the test result is other than "1" (NO in step S170), electrical contact between the IC device and the socket 301 has still not been secured, so, first, in the step S180, the correction unit 323 judges whether the counter m is a predetermined number of times M or less (m .M). As the predetermined number of times M, for example five times to 10 times may be mentioned.

When it is judged in the step S170 that the test result is other than "1" (in at step S170) and it is judged in the step S180 that the counter m is the predetermined number of times M or less (YES in the step S180), the stroke setting device 320 repeats a correction to increase the torque in the steps S110 to S160.

As opposed to this, when it is judged in the step S180 that the counter is larger than the predetermined number of times M (NO in the step S180), the correction unit 323 stops the optimum stroke setting work by the stroke setting device 320 and the alarm unit 325 alerts the operator to that the optimum stroke setting work has been suspended. Due to this, when the contact failure of the IC device and the socket 301 is due to a reason other than an insufficient stroke and electrical contact between the IC device and the socket 301 cannot be secured in the end, it is possible to automatically stop the work of setting the optimum stroke.

When it is judged in the step S50 or the step S170 that the test result is "1" (YES in the step S50 or YES in the step S170), to prevent shortening of the life of the socket due to excessive torque, the stroke setting device 320 executes a correction to reduce the torque of the steps S210 to S250.

First, in the step S210, the control device 316 executes control to rise the contact arm 312.

Next, the correction unit 323 executes control to reduce the torque (the step S220). The instructing unit 321 instructs the control device 316 on this corrected torque. Note that the torque which the correction unit 323 reduces at the step S220 is the theoretical torque inputted by the operator at the step S10 when directly proceeding from step S50 and is the corrected torque corrected at the step S130 of the immediately nearby cycle when proceeding from the step S170. Further, the decrease rate β of the torque corrected by the correction unit 323 is, for example, 1 to 2% or of the torque before correction. The decrease rate β is relatively smaller than the increase rate α (β<α).

The contact arm 312 makes the IC device descend again toward the socket 301 and pushes the IC device against the socket 301. When the torque by which the contact arm 312 pushes the device reaches the correction torque instructed by the instructing unit 321, the control device 316 stops the descending operation of the contact arm 312. In that state, the tester 20 tests the IC device (the step S230).

Next, the acquiring unit 322 acquires the test result from the tester (the step S240). The correction unit 323 judges whether the test result is "1" or not (the step S250).

When it is judged in this step S250 that the test result is "1" (NO in the step S250), the torque is still excessive, so a correction to reduce the torque in the steps S210 to S240 is executed.

Figure 5B:
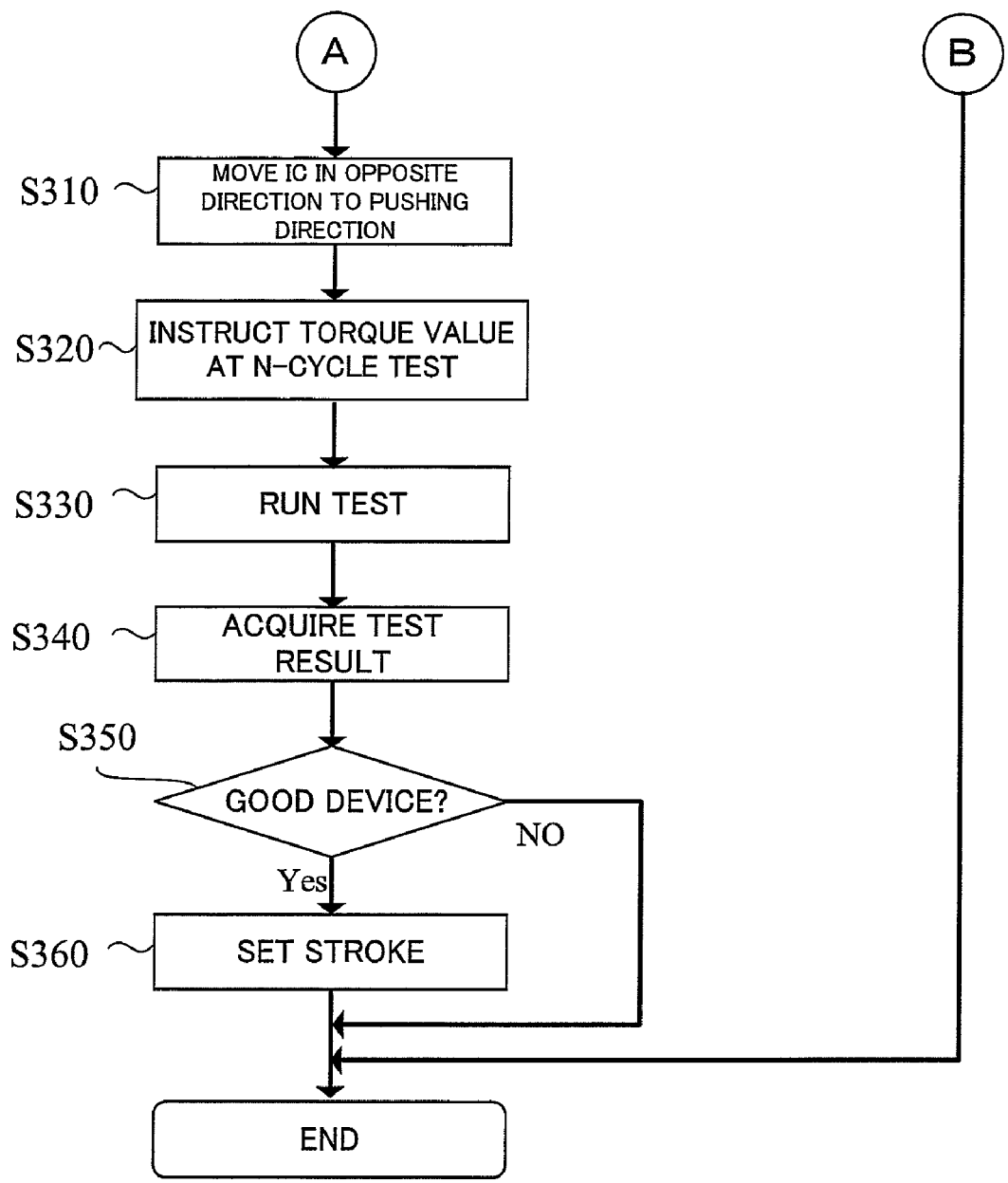
FIG. 5B is a flowchart showing the method of setting an optimum stroke of a contact arm according to an embodiment of the present invention (part 2).

As opposed to this, when it is judged in the step S250 that the test result is other than "1" (NO in the step S250), the correction unit 323 does not correct the torque, but proceeds to the steps S310 to S360 shown in FIG. 5B to set the optimum stroke value.

As shown by the flow chart of FIG. 5B, first, the control device 316 executes control to rise the contact arm 321 executes (the step S310). The setting device 324 instructs the control device 316 on the torque value instructed in the test of the N-th cycle (the step S320).

Note that the "torque value in the test of the N-th cycle" means the torque value in the test of the immediately preceding (N-th) cycle when defining the cycle where it is judged in the step S250 that the test result is other than "1" as the N+1st cycle. For example, when repeating the cycle of reducing the torque in the steps S210 to S250 a plurality of number of times and the device under test becomes defective in the test of the N+1st cycle, it is the torque value in the test of the N-th cycle. Further, when the result is immediately a good product in the test of the cycle reducing the torque of the steps S210 to S250 right after the cycle increasing the torque of the steps S110 to S180, it is the torque value at the test of the last cycle of the steps S110 to S180.

Next, the test of the IC device is executed by the torque value in the test of the N-th cycle (the step S340). The setting unit 324 acquires the test results (the step S340) and judges whether the test result is "1" or not (the step S350).

When it is judged at the step S350 that the test result is other than "1" (NO in the step S350), the optimum stroke setting work by the stroke setting device 320 is forcibly stopped and the alarm unit 325 alerts the operator to that the optimum stroke setting work has been stopped.

When it is judged in the step S350 that the test result is "1" (YES in the step S350), the setting unit 324 calculates the stroke L of the contact arm 312 at the time of the test and sets that stroke L as the optimum stroke for use at the time of an actual test in the control device 316 (the step S360).

That is, when the test result at the time of the N+1st (where N is a natural number) test is other than "1" (abnormal), in the step S250, the correction unit 323 no longer corrects the torque, but the setting unit 324 tests the IC device by the torque value at the time of the N-th test, measures the stroke L, and sets the stroke L as the optimum stroke.

After the stroke setting work is completed, the test unit conveyor system 310 conveys the IC device to the unloader buffer unit 602, whereby the IC device is discharged to the classification tray stocker 402 of the IC device storage unit 40 through the unloader buffer unit 602 and the unloader unit conveyor system 601.

In the above way, according to the electronic device test apparatus of the present embodiment, at the time of changing the type of the IC devices, at the time of changing the sockets, etc., it is possible to automatically set the optimum stroke of the contact arms.

Note that the above explained embodiment was described to facilitate understanding of the present invention and was not described to limit the present invention. Therefore, the elements disclosed in the above embodiment include all design changes and equivalents falling under the technical scope of the present invention.

For example, in the flow chart shown in FIG. 5A, the steps of increasing the torque from step S210 to S250 are not essential requirements of the present invention. When it is judged in the step S170 that the test result is "1", it is also possible for the setting unit 324 to set the stroke L at the time of the test as the optimum stroke in the control device 316.

Further, in the above embodiments, the explanation was given of setting the optimum stroke after changing the type of the IC device under test or after changing the socket 301, but it is also possible to reset the optimum stroke of the contact arms by the method according to the present embodiment when changing the lot of the devices under test or when defective devices continue to be found in the middle of testing.

Further, in the above embodiment, when the torque was not corrected by the correction unit 323 (NO in the step S250 of FIG. 5A), the setting unit 324 measures the stroke L of the contact arm 312 by again executing a normal test (the steps S310 to S360 of FIG. 5B), but the present invention is not particularly limited to this.

For example, each time the tester 20 executes a test (each the step S140 or S230 of FIG. 5A), the stroke L is measured and stored. The setting unit 324 may also extract the stroke L at the time of a normal test when the correction unit 323 does not correct the torque (NO in the step S250 of FIG. 5A).

Alternatively, each time a normal test result is obtained (each time the test result is "1" in the step S150 or S240 of FIG. 5A), the stroke L is measured and updated. The setting unit 324 may also call up the latest stroke L when the correction unit 323 does not correct the torque (NO in the step S250 of FIG. 5A)

Further, in the above embodiment, setting only the optimum stroke was explained, but when controlling the pushing of the contact arm by torque control at the time of an actual test, instead of setting the optimum stroke of the contact arm or in addition to setting the optimum stroke, it is possible to set the optimum torque used at the time of an actual test.

The invention claimed is:

1. A method of setting an optimum pushing condition for a contact arm pushing a device under test (DUT) against a socket, the method comprising:
    (i) instructing a control device of the contact arm on a magnitude of torque of a motor of the contact arm;
    (ii) pushing the DUT against the socket by the contact arm according to the instructed torque;
    (iii) testing the DUT and identifying one of a normal test result and an abnormal test result from the testing of the DUT; and
    (iv) increasing the magnitude of torque when the abnormal test result is identified at the (iii),
    wherein
    the (i)-(iv) are repeated until the normal test result is identified at the (iii), and a pushing condition of the contact arm at the time of the normal test result is set as the optimum pushing condition if the normal test result is identified at the (iii), wherein
    when the (iv) has been executed more than a predetermined number of times, the method is discontinued and the fact that the method is discontinued is alerted.

2. The method of setting the optimum pushing condition for a contact arm as set forth in claim 1, wherein
    the pushing condition of the contact arm includes a stroke of the contact arm along the vertical direction.

3. The method of setting the optimum pushing condition for a contact arm as set forth in claim 1, wherein
    the pushing condition of the contact arm includes a pushing torque of the contact arm.

4. A method of setting an optimum pushing condition for a contact arm pushing a device under test (DUT) against a socket, the method comprising:
    (i) instructing a control device of the contact arm on a magnitude of torque of a motor of the contact arm;
    (ii) pushing the DUT against the socket by the contact arm according to the instructed torque;
    (iii) testing the DUT and identifying one of a normal test result and an abnormal test result from the testing of the DUT;
    (iv) increasing the magnitude of torque when the abnormal test result is identified at the (iii); and
    (v) decreasing the magnitude of torque when the normal test result is identified at the (iii), wherein the (i)-(iv) are repeated until the normal test result is identified at the (iii), and thereafter, the (i)-(iii) and (v) are repeated until the abnormal test result is identified at the (iii), and a pushing condition of the contact arm at the time of the last normal test result is set as the optimum pushing condition if the abnormal test result is identified at the (iii), wherein when the (iv) has been executed more than a predetermined number of times, the method is discontinued and the fact that the method is discontinued is alerted.

5. The method of setting the optimum pushing condition for a contact arm as set forth in claim 4, wherein the pushing condition of the contact arm includes a stroke of the contact arm along the vertical direction.

6. The method of setting the optimum pushing condition for a contact arm as set forth in claim 4, wherein when the abnormal test result is identified at the N+1st (iii) (where N is a natural number), the pushing condition of the contact arm at the N-th (iii) is set as the optimum pushing condition.

7. The method of setting the optimum pushing condition for a contact arm as set forth in claim 4, wherein the torque decrease rate at the (v) is smaller relative to the torque increase rate at the (iv).

8. The method of setting the optimum pushing condition for a contact arm as set forth in claim 4, wherein the pushing condition of the contact arm includes a pushing torque of the contact arm.

9. A method of setting an optimum pushing condition for a contact arm pushing a device under test (DUT) against a socket, the method comprising:

(i) instructing a control device of the contact arm on a magnitude of torque of a motor of the contact arm;

(ii) pushing the DUT against the socket by the contact arm according to the instructed torque;

(iii) testing the DUT and identifying one of a normal test result or an abnormal test result from the testing of the DUT; and (iv) increasing the magnitude of torque when the abnormal test result is identified at the (iii), wherein the (i)-(iv) are repeated until the normal test result is identified at the (iii), and when the (iv) has been executed more than a predetermined number of times, the method is discontinued and the fact that the method is discontinued is alerted.

* * * * *